(12) United States Patent
Pruss et al.

(10) Patent No.: US 8,169,767 B2
(45) Date of Patent: May 1, 2012

(54) BORON NITRIDE AGGLOMERATED POWDER AND DEVICES COMPRISING THE POWDER

(75) Inventors: Eugene A. Pruss, Hamburg, NY (US); Thomas M. Clere, Orchard Park, NY (US)

(73) Assignee: Saint-Gobain Ceramics & Plastics, Inc., Worcester, MA (US)

( * ) Notice: Subject to any disclaimer, the term of this patent is extended or adjusted under 35 U.S.C. 154(b) by 0 days.

(21) Appl. No.: 13/033,325

(22) Filed: Feb. 23, 2011

(65) Prior Publication Data

US 2011/0147064 A1 Jun. 23, 2011

Related U.S. Application Data

(62) Division of application No. 12/276,067, filed on Nov. 21, 2008, now Pat. No. 7,914,886, which is a division of application No. 10/645,305, filed on Aug. 21, 2003, now Pat. No. 7,494,635.

(51) Int. Cl.
*C01B 21/064* (2006.01)
*H05K 1/00* (2006.01)

(52) U.S. Cl. .......................... 361/226; 361/748; 423/290

(58) Field of Classification Search .................. 428/402; 423/290; 361/226, 748
See application file for complete search history.

(56) References Cited

U.S. PATENT DOCUMENTS

| | | | |
|---|---|---|---|
| 2,991,508 A | 7/1961 | Reuben et al. |
| 3,125,547 A | 3/1964 | Blatz et al. |
| 3,351,690 A | 11/1967 | Stover |
| 3,617,358 A | 11/1971 | Dittrich |
| 3,720,740 A | 3/1973 | Muta et al. |
| 3,954,483 A | 5/1976 | Prochazka |
| 4,097,293 A | 6/1978 | Komeya et al. |
| 4,107,276 A | 8/1978 | Schwetz et al. |
| 4,188,194 A | 2/1980 | Corrigan |
| 4,195,002 A | 3/1980 | Radtke et al. |
| 4,394,170 A | 7/1983 | Sawaoka et al. |
| 4,412,008 A | 10/1983 | Miyamoto et al. |
| 4,514,370 A | 4/1985 | Inoue et al. |
| 4,634,640 A | 1/1987 | Hunold et al. |
| 4,642,298 A | 2/1987 | Kuramoto et al. |
| 4,731,311 A | 3/1988 | Suzuki et al. |

(Continued)

FOREIGN PATENT DOCUMENTS

AU 67727/90 6/1991

(Continued)

OTHER PUBLICATIONS

"AlSiC Microwave Packages," *Microwave Journal* pp. 39(6):90,92,94 (1996).

(Continued)

*Primary Examiner* — Hoa (Holly) Le
(74) *Attorney, Agent, or Firm* — LeClairRyan, a Professional Corporation (57) ABSTRACT

Novel boron nitride agglomerated powders are provided having controlled density and fracture strength features. In addition methods for producing same are provided. One method calls for providing a feedstock powder including boron nitride agglomerates, and heat treating the feedstock powder to form a heat treated boron nitride agglomerated powder. In one embodiment the feedstock powder has a controlled crystal size. In another, the feedstock powder is derived from a bulk source. Devices, such as microelectronic devices and printed circuit boards, which include boron nitride agglomerates with controlled fracture strength features are also disclosed.

6 Claims, 6 Drawing Sheets

U.S. PATENT DOCUMENTS

| | | | |
|---|---|---|---|
| 4,784,978 A | 11/1988 | Ogasawara et al. | |
| 4,801,445 A | 1/1989 | Fukui et al. | |
| 4,863,881 A | 9/1989 | Ahrens et al. | |
| 4,869,954 A | 9/1989 | Squitieri | |
| 4,882,225 A | 11/1989 | Fukui et al. | |
| 4,927,587 A | 5/1990 | Takahashi et al. | |
| 4,971,779 A | 11/1990 | Paine, Jr. et al. | |
| 4,997,633 A | 3/1991 | Koshida et al. | |
| 5,001,091 A | 3/1991 | Pujari et al. | |
| 5,011,870 A | 4/1991 | Peterson | |
| 5,039,435 A | 8/1991 | Hanano | |
| 5,063,184 A | 11/1991 | Tsuyoshi et al. | |
| 5,064,589 A | 11/1991 | Ichikawa et al. | |
| 5,098,609 A | 3/1992 | Iruvanti et al. | |
| 5,116,589 A | 5/1992 | Hoenig | |
| 5,120,688 A | 6/1992 | Hsieh | |
| 5,194,480 A | 3/1993 | Block et al. | |
| 5,213,868 A | 5/1993 | Liberty et al. | |
| 5,229,339 A | 7/1993 | Pujari et al. | |
| 5,234,712 A | 8/1993 | Howard | |
| 5,273,558 A | 12/1993 | Nelson et al. | |
| 5,283,542 A | 2/1994 | Ochiai et al. | |
| 5,285,108 A | 2/1994 | Hastings et al. | |
| 5,298,791 A | 3/1994 | Liberty et al. | |
| 5,308,044 A | 5/1994 | Nakashima et al. | |
| 5,312,571 A | 5/1994 | Pujari et al. | |
| 5,320,989 A | 6/1994 | Chapman et al. | |
| 5,332,629 A | 7/1994 | Sumiya et al. | |
| 5,374,036 A | 12/1994 | Rogers et al. | |
| 5,409,868 A | 4/1995 | Dasgupta et al. | |
| 5,457,075 A | 10/1995 | Fukushima et al. | |
| 5,466,269 A | 11/1995 | Corrigan et al. | |
| 5,466,400 A | 11/1995 | Pujari et al. | |
| 5,508,110 A | 4/1996 | Howard | |
| 5,510,174 A | 4/1996 | Litman | |
| 5,525,557 A | 6/1996 | Pujari et al. | |
| 5,528,462 A | 6/1996 | Pendse | |
| 5,536,485 A | 7/1996 | Kume et al. | |
| 5,545,473 A | 8/1996 | Ameen et al. | |
| 5,567,353 A | 10/1996 | Bogan et al. | |
| 5,571,760 A | 11/1996 | Pujari et al. | |
| 5,591,034 A | 1/1997 | Ameen et al. | |
| 5,593,773 A | 1/1997 | McKay et al. | |
| 5,601,874 A | 2/1997 | Howard et al. | |
| 5,610,203 A | 3/1997 | Buckmaster et al. | |
| 5,614,319 A | 3/1997 | Wessels et al. | |
| 5,660,917 A | 8/1997 | Fujimori et al. | |
| 5,681,883 A | 10/1997 | Hill et al. | |
| 5,688,449 A | 11/1997 | Fox et al. | |
| 5,688,457 A | 11/1997 | Buckmaster et al. | |
| 5,696,041 A | 12/1997 | Collins et al. | |
| 5,716,665 A | 2/1998 | Vita et al. | |
| 5,726,502 A | 3/1998 | Beddingfield | |
| 5,738,936 A | 4/1998 | Hanrahan | |
| 5,759,481 A | 6/1998 | Pujari et al. | |
| 5,770,819 A | 6/1998 | Mehan | |
| 5,781,412 A | 7/1998 | De Sorgo | |
| 5,783,308 A | 7/1998 | Leendersen | |
| 5,849,316 A | 12/1998 | Mellul et al. | |
| 5,854,155 A | 12/1998 | Kawasaki et al. | |
| 5,898,009 A | 4/1999 | Shaffer et al. | |
| 5,898,217 A | 4/1999 | Johnston | |
| 5,907,474 A | 5/1999 | Dolbear | |
| 5,908,796 A | 6/1999 | Pujari et al. | |
| 5,926,371 A | 7/1999 | Dolbear | |
| 5,945,217 A | 8/1999 | Hanrahan | |
| 5,945,478 A | 8/1999 | Buckmaster et al. | |
| 5,950,066 A | 9/1999 | Hanson et al. | |
| 5,962,122 A | 10/1999 | Walpita et al. | |
| 5,981,641 A | 11/1999 | Takahashi et al. | |
| 5,984,055 A | 11/1999 | Strasser et al. | |
| 5,985,228 A | 11/1999 | Corrigan et al. | |
| 6,048,511 A | 4/2000 | Shaffer et al. | |
| 6,054,520 A | 4/2000 | Washio et al. | |
| 6,096,671 A | 8/2000 | Kawasaki et al. | |
| 6,110,527 A | 8/2000 | Brun et al. | |
| 6,124,579 A | 9/2000 | Steinhauser et al. | |
| 6,158,894 A | 12/2000 | Pujari et al. | |
| 6,162,849 A | 12/2000 | Zhuo et al. | |
| 6,168,859 B1 | 1/2001 | Mills et al. | |
| 6,186,859 B1 | 2/2001 | Hickman et al. | |
| 6,251,513 B1 | 6/2001 | Rector et al. | |
| 6,255,376 B1 | 7/2001 | Shikata et al. | |
| 6,284,817 B1 | 9/2001 | Cross et al. | |
| 6,287,489 B1 | 9/2001 | Rolander et al. | |
| 6,300,607 B1 | 10/2001 | Steinhauser et al. | |
| 6,319,602 B1 | 11/2001 | Fauzi et al. | |
| 6,348,179 B1 | 2/2002 | Paine et al. | |
| 6,541,111 B2 | 4/2003 | Fauzi et al. | |
| 6,548,152 B2 | 4/2003 | Nakatani et al. | |
| 6,585,039 B2 | 7/2003 | Sagal et al. | |
| 6,645,612 B2 | 11/2003 | Pujari et al. | |
| 6,652,822 B2 | 11/2003 | Phillips et al. | |
| 6,660,241 B2 | 12/2003 | Clere et al. | |
| 6,676,893 B2 | 1/2004 | Rolander et al. | |
| 6,713,088 B2 | 3/2004 | Lodyga et al. | |
| 6,764,975 B1 | 7/2004 | Clere | |
| 6,794,435 B2 | 9/2004 | Clere | |
| 6,824,753 B2 | 11/2004 | Paine et al. | |
| 6,867,445 B2 | 3/2005 | Jang | |
| 6,951,583 B2 | 10/2005 | Clere et al. | |
| 7,189,774 B2 | 3/2007 | Clere | |
| 7,494,635 B2 * | 2/2009 | Pruss et al. | 423/290 |
| 7,557,054 B2 | 7/2009 | Oda et al. | |
| 7,914,886 B2 * | 3/2011 | Pruss et al. | 428/323 |
| 2001/0021740 A1 | 9/2001 | Lodyga et al. | |
| 2001/0048179 A1 | 12/2001 | Stewart et al. | |
| 2002/0000651 A1 | 1/2002 | Takizawa et al. | |
| 2002/0006373 A1 | 1/2002 | Clere | |
| 2002/0006511 A1 | 1/2002 | Clere | |
| 2002/0155052 A1 | 10/2002 | Paine et al. | |
| 2003/0038278 A1 | 2/2003 | Ishihara | |
| 2004/0077764 A1 | 4/2004 | Lodyga et al. | |
| 2004/0208812 A1 | 10/2004 | Clere | |
| 2005/0041373 A1 * | 2/2005 | Pruss et al. | 361/508 |
| 2006/0121068 A1 | 6/2006 | Sane et al. | |
| 2006/0127422 A1 | 6/2006 | Lodyga et al. | |
| 2006/0228542 A1 | 10/2006 | Czubarow | |
| 2007/0041918 A1 | 2/2007 | Meneghetti et al. | |
| 2007/0205706 A1 | 9/2007 | Yamada et al. | |
| 2008/0076856 A1 | 3/2008 | Zhong et al. | |

FOREIGN PATENT DOCUMENTS

| | | |
|---|---|---|
| AU | 9067727 | 6/1991 |
| BR | 9006359 | 9/1991 |
| CA | 2031834 | 6/1991 |
| CA | 20318324 | 6/1991 |
| CA | 2389963 | 6/2001 |
| CN | 1269273 A | 11/2000 |
| CN | 1834167 A | 9/2006 |
| DE | 2629960 A1 | 1/1978 |
| DE | 39 17 726 A1 | 7/1990 |
| DE | 4013025 A1 | 10/1990 |
| EP | 0279769 | 8/1988 |
| EP | 0396448 A1 | 11/1990 |
| EP | 432007 | 6/1991 |
| EP | 0479387 | 4/1992 |
| EP | 0717020 A2 | 6/1996 |
| EP | 0896031 | 2/1999 |
| EP | 0939066 | 9/1999 |
| EP | 0982391 | 3/2000 |
| EP | 1 053 973 A1 | 11/2000 |
| EP | 1702907 A2 | 9/2006 |
| FI | 906048 | 6/1991 |
| FI | 9006048 | 6/1991 |
| FR | 2655638 | 6/1991 |
| GB | 870084 | 6/1961 |
| GB | 1179156 A | 1/1970 |
| GB | 2301818 A | 12/1996 |
| JP | 58060679 A | 4/1983 |
| JP | 58060680 A | 4/1983 |
| JP | 61132564 A | 6/1986 |
| JP | 61268763 | 11/1986 |
| JP | 62123070 A | 6/1987 |
| JP | 63006093 A | 1/1988 |
| JP | 63040769 A | 2/1988 |
| JP | 63045104 A | 2/1988 |

| | | | |
|---|---|---|---|
| JP | 63045178 A | 2/1988 | |
| JP | 63117966 A | 5/1988 | |
| JP | 64-38424 A | 2/1989 | |
| JP | 1038424 | 2/1989 | |
| JP | 1065073 A | 3/1989 | |
| JP | 1119564 A | 5/1989 | |
| JP | 1122971 A | 5/1989 | |
| JP | 1126661 | 5/1989 | |
| JP | 1131062 A | 5/1989 | |
| JP | 1131065 A | 5/1989 | |
| JP | 1131066 A | 5/1989 | |
| JP | 1133982 A | 5/1989 | |
| JP | 1239066 A | 9/1989 | |
| JP | 1275471 A | 11/1989 | |
| JP | 89054379 | 11/1989 | |
| JP | 2044067 A | 2/1990 | |
| JP | 2055766 A | 2/1990 | |
| JP | 2092868 A | 4/1990 | |
| JP | 2164433 | 6/1990 | |
| JP | 3012316 A | 1/1991 | |
| JP | 3177361 A | 8/1991 | |
| JP | 3215364 A | 9/1991 | |
| JP | 4065366 A | 3/1992 | |
| JP | 4164805 A | 6/1992 | |
| JP | 04321506 | 11/1992 | |
| JP | 5000853 A | 1/1993 | |
| JP | 5000854 A | 1/1993 | |
| JP | 5078106 | 3/1993 | |
| JP | 5148038 A | 6/1993 | |
| JP | 06219714 A | 8/1994 | |
| JP | 06-321638 A | 11/1994 | |
| JP | 7041311 A | 2/1995 | |
| JP | 07-157369 A1 | 6/1995 | |
| JP | 07157369 | 6/1995 | |
| JP | 07204492 A | 8/1995 | |
| JP | 7315937 A | 12/1995 | |
| JP | 08-127793 A | 5/1996 | |
| JP | 08183906 A | 7/1996 | |
| JP | 2590908 | 3/1997 | |
| JP | 2590964 | 3/1997 | |
| JP | 09151324 | 6/1997 | |
| JP | 9202663 A | 8/1997 | |
| JP | 10194711 | 7/1998 | |
| JP | 10204300 | 8/1998 | |
| JP | 11060215 | 3/1999 | |
| JP | 11116213 | 4/1999 | |
| JP | 11-134944 A | 5/1999 | |
| JP | 11209618 | 8/1999 | |
| JP | 11-269302 A | 10/1999 | |
| JP | 11-277515 | 10/1999 | |
| JP | 11005907 | 10/1999 | |
| JP | 11277515 | 10/1999 | |
| JP | 2981002 | 11/1999 | |
| JP | 2000-34107 | 2/2000 | |
| JP | 2000-63180 A | 2/2000 | |
| JP | 200034107 | 2/2000 | |
| JP | 2003-508259 | 7/2000 | |
| JP | 2000508259 | 7/2000 | |
| JP | 2000279796 A | 10/2000 | |
| JP | 2001010867 A | 1/2001 | |
| JP | 2001-122615 A | 5/2001 | |
| JP | 2001172604 A | 6/2001 | |
| JP | 3290127 | 6/2002 | |
| JP | 2003-518185 | 6/2003 | |
| JP | 2005036016 A | 2/2005 | |
| NO | 905289 | 6/1991 | |
| NO | 9005289 | 6/1991 | |
| PT | 96113 | 9/1991 | |
| SU | 514796 | 5/1976 | |
| WO | WO 97/37828 | 10/1997 | |
| WO | WO 01/46313 | 6/2001 | |
| WO | WO 01/83371 | 11/2001 | |
| WO | WO 02/088234 | 11/2002 | |
| WO | WO 2006/023860 A2 | 3/2006 | |
| WO | WO 2006/117117 A1 | 11/2006 | |

OTHER PUBLICATIONS

"Boron," *Ceramic Industry Materials Handbook* pp. 62,64 (1997).
Bathe et al., "BN Protective Coating for High Temperature Applications," *Mat. Res. Soc., Symp. Proc.* 697:61-6 (2002).
Chemical Abstracts, AN 118:127738, Columbus, OH, USA, corresponding to JP 04321506 A2, (Abstract) (copyright 2002—Month unavailable).
Chemical Abstracts, AN 123:177515, Columbus, OH, USA, corresponding to JP 07157369 A2, (Abstract) (copyright 2002—Month unavailable).
Chemical Abstracts, AN 130:96383, Columbus, OH, USA, corresponding to JP 11005907 A2, (Abstract) (copyright 2002—Month unavailable).
Combat Boron Nitride Powders Specifications, Carborundum, p. 1 of 2 (1990).
Derwent Abstract on WPIX, London: Derwent Publications Ltd., AN 1998-476912, JP10204300 A, (Mitsui Petrochem Ind Co Ltd), abstract, (1998—month unknown).
Derwent Abstract on WPIX, London: Derwent Publications Ltd., AN 1997-359228, JP 09151324 A, (Fuji Kobunshi Kogyo KK), abstract, (1997—month unknown).
Engler et al., "Hexagonal Baron Nitride (hBN)—Applications from Metallurgy to Cosmetics," *Ceramic Forum International* 84(12):E49—E53 (2007).
Georgeoni et al., "Sintered Materials Based on the Hexagonal and Cubic Boron Nitride," *Powder Metallurgy* pp. 247-249 (1994).
Hagio & Yoshida, "Sintering and Crystallization of Ground Hexagonal Boron Nitride Powders," *Journal of Materials Science Letters* 13:653-5 (1994).
Hagio et al., "Sintered BN Products Obtained from a Ground BN Powder and Its Sintering Processes," *Journal of the Ceramic Society of Japan* 162(10):940-3 (1994).
Hagio et al., "Sintering of the Mechanochemically Activated Powders of Hexagonal Boron Nitride," *J. Am. Ceram. Soc.* 72(8):1482-84 (1989).
Hubáček & Ueki, "Pressureless-Sintered Boron Nitride with Limited Content of Boric Oxide," *Materials Science Research International* 1(4):209-12 (1995).
International Preliminary Examination Report for International Patent Application No. PCT/US01/14041 (Nov. 16, 2002).
International Search Report for International Patent Application No. PCT/US01/14041 (Dec. 7, 2001).
International Search Report for International Patent Application No. PCT/US2004/026765 (Dec. 3, 2004).
Itoh et al., "Effects of Added c-BN Seed Crystals on the Reaction Sintering of c-BN Accompanied by a Conversion from h-BN to c-BN," *Journal of Materials Science* 25:203-6 (1990).
Kabyshev et al., "Physical Properties of Polycrystalline Cubic Boron Nitride," *Inorganic Materials* 32(2):146-50 (1996).
Machine Translation of EP 0 396 448 A (Disclosure and Claims), obtained online @ http://ep.espacenet.com/, EP 0 396 448 A published Nov. 1990, Machine Translation downloaded Feb. 4, 2010, 6 pages.
Masters K: "Spray Drying Hand Book" 1985, Longman Scientific & Technical New York, XP002386938, p. 171, first paragraph.
Miyazaki et al., "Microstructure of Pressureless Sintered h-BN," *Journal of the Ceramic Society of Japan, Int. Edition* 99:566-9 (1991).
Morgiel & Benko, "Microstructure of Boron Nitride Sintered with Titanium," *Materials Letters* 25:49-52 (1995).
Ohsawa et al., "Sintering of hBN Using Polysilazane," *Journal of the Ceramic Society of Japan* 102:646-9 (1994).
Olszyna, "Deposition of BN Coatings by Spraying a Powder Accelerated Electrodynamically in a Coaxial Pulse Plasma Generator," *Thin Solid Films* 277:79-82 (1996).
Phone Call Report (Oct. 20, 1998), shipment information (Oct. 23, 1998) for XP-1115 and Experimental Product Analysis (Oct. 23, 1998).
Quotation (Dec. 2, 1999), Request for Quotation Form for Item 1, Item 2, and Item 3 (Nov. 30, 1999), Experimental Product Analysis for XP1101 (Oct. 18, 1999) and Experimental Product Analysis for XP 1123 (Nov. 12, 1999).

Quotation (Jun. 5, 1998) and Request for Quotation Form (May 15, 1998) with Phone Call Report (May 15, 1998), Experimental Product Analysis for XP1101 (May 8, 1998), and Experimental Product Analysis for XP1101 (May 26, 1998).
Quotation (May 19, 1999) and Experimental Product Analysis for XP1104 (May 18, 1999).
Supplementary European Search Report for European Patent Application No. EP02756606 (Sep. 17, 2009).
Supplementary Partial European Search Report for European Patent Application No. EP02756606 (Jun. 29, 2006).
International Search Report for International Patent Application No. PCT/US02/23396 (Dec. 13, 2002).
Written Opinion for International Patent Application No. PCT/US01/14041 (Jun. 3, 2003).
Written Opinion for International Patent Application No. PCT/US02/23396 (Jun. 3, 2003).
Written Opinion for International Patent Application No. PCT/US2004/026765 (Dec. 3, 2004).
Tres BN Boron Nitride Powder, 2 pages (May 1998).
Rudin et al., "Fluorocarbon Elastomer Aids Polyolefin Extrusion," Plastics Engineering, Society of Plastics Engineers, Inc., Greenwich, CT, US, pp. 63-66 (1986).
Rosenbaum et al., "Boron Nitride as a Processing Aid for the Extrusion of Polyolefins and Fluoropolymers," Rapra Abstracts, Pergamon Press, Ltd., Oxford, GB p. 168 (2000).
Hagio et al., "Sintering of the Mechanochemically Activated Powders of Hexagonal Boron Nitride," *J. Am. Cer. Soc.*, 72:1482-1484 (1989).
Yip et al., "The Effect of the Boron Nitride Type and Concentration of the Rheology and Processability of Molten Polymers," ANTEC 1999, Tech. Papers, 45, New York (1999).
Rosenbaum et al., "A New Processing Additive Eliminating Surface and Gross Melt Fracture in the Extrusion of Polyolefins and Fluoropolymers," ANTEC (1998).
Seth et al., "The Effect of Surface Energy of Boron Nitride Powders on Gross Melt Fracture Elimination," ANTEC (2001).
Rosenbaum et al., "Boron Nitride as a Processing Aid for the Extrusion of Polyolefins and Fluoropolymers," *Polymer Engineering and Science* 40(1):179-190 (2000).
Quotation (Jun. 5, 1998) and Request for Quotation Form (May 15, 1998).
Quotation (Dec. 2, 1999) and Request for Quotation Form for Item 1, Item 2, and Item 3 (Nov. 30, 1999).
Phone Call Report (Oct. 20, 1998), Shipment Information for XP 1115 and Experimental Product Analysis (Oct. 23, 1998).
Quotation (May 19, 1999) and Experimental Product Analysis for XP 11047 (May 18, 1999).
Carborundum Boron Nitride Data Sheet, "Cosmetic Grade Boron Nitride Powders" (Jun. 1998).
Silicones & Silicon-Containing Polymers, Petrarch Systems Silanes and Silicones: Silicon Compounds Register & Review (1987).
Jimenez et al., Core-level Photoabsorption Study of Defects and Metastable Bonding Configurations in Boron Nitride, *The America Physical Society* 55(18):12 025-12 037 (1997).
Trice et al., "Investigation of the Physical and Mechanical Properties of Hot-Pressed Boron Nitride/Oxide Ceramic Composites," *J. Am. Ceram. Soc.* 82(9):2563-2565 (1999).
Machine Translation of Publ. No. JP 07-157369, published Jun. 1995, Japan patent Office, Tokyo, Japan, obtained online @ http://www19.ipdl.inpit.go.jp/PA1/cgi-bin/PAIINDEX (Downloaded Oct. 25, 2011).
G.L. Messing, "Calcination and Phase Transformation", pp. 887-893, Edited by Buschow et al (2001) Encyclopedia of Materials-Science and Technology, vol. 1-11, (Knovel release date Sep. 12, 2008), Elsevier, Online version @ http://www.knovel.com/web/portal/browse/display?_EXT_KNOVEL_DISPLAY_bookid=1871&VerticalID=0.
Combat Boron Nitride Powders Specifications, Carborundum, p. 1-2 (1990).
Derwent Abstract on EAST, London: Derwent Publications Ltd., AN1978-04412A, Derwent week 197926, DE 2629960 A (Moscow Mendeleev Chem IN), abstract. (1978).
Machine Translation of Pub. No. EP 0 432 007 A1, published Jun. 1991, European Patent Office, obtained online at @ http://ep.espacenet.com/numberSearch?locale=en_EP (Downloaded Dec. 6, 2010), pp. 1-4.
Yip et al., "Effect of Combining Boron Nitride with Fluoroelastomer on the Melt Fracture of HDPE in Extrusion Blow Molding," J. Vinyl & Additive Tech. 6(4):196-204 (2000).
Dean et al., "Novel Thermal Interface Material with Aligned Conductive Fibers," Johnson Matthey Electronics, Spokane, WA, International Symposium on Microelectronics, SPIE Proceedings Series 3906:462-467 (1999).
GE Advanced Ceramics, "PolarTherm Thermally Conductive Boron Nitride Fillers for Polymeric Materials," Brochure (1997).

* cited by examiner

BORON NITRIDE AGGLOMERATED POWDER AND DEVICES COMPRISING THE POWDER

CROSS-REFERENCE TO RELATED APPLICATION(S)

The present application is a divisional application of U.S. patent application Ser. No. 12/276,067, filed Nov. 21, 2008, now U.S. Pat. No. 7,914,886, which is a divisional application of U.S. patent application Ser. No. 10/645,305, filed Aug. 21, 2003, now U.S. Pat. No. 7,494,635, entitled "BORON NITRIDE AGGLOMERATED POWER," naming inventors Eugene A. Pruss and Thomas M. Clere, which applications are incorporated by reference herein in their entirety.

BACKGROUND

1. Field of the Invention

The present invention relates generally to methods for producing agglomerated boron nitride powders, powders formed thereby, and components incorporating such powders.

2. Description of the Related Art

Microelectronic devices, such as integrated circuit chips, are becoming smaller and more powerful. The current trend is to produce integrated chips that are steadily increasing in density and perform more functions in a given period of time over predecessor chips. This results in an increase in power consumption and generation of more heat, and accordingly, heat management has become a primary concern in the development of electronic devices.

Typically, heat generating sources or devices, such as integrated circuit chips, are mated with heat sinks to remove heat that is generated during operation. However, thermal contact resistance between the source or device and the heat sink limits the effective heat removing capability of the heat sink. During assembly, it is common to apply a layer of thermally conductive grease, typically a silicone grease, or a layer of a thermally conductive organic wax to aid in creating a low thermal resistance path between the opposed mating surfaces of the heat source and the heat sink. Other thermally conductive materials are based upon the use of a binder, preferably a resin binder, such as, a silicone, a thermoplastic rubber, a urethane, an acrylic, or an epoxy, into which one or more thermally conductive tillers are distributed.

Typically, these tillers are one of two major types: thermally conductive and electrically insulative, or thermally conductive and electrically conductive fillers. Aluminum oxide, magnesium oxide, zinc oxide, aluminum nitride, and boron nitride are the most often cited types of thermally conductive and electrically insulative fillers used in thermal products. Boron nitride is especially useful in that it has excellent heat transfer characteristics and is relatively inexpensive.

However, in order to achieve sufficient thermal conductivity with presently used fillers, such as boron nitride, it has been necessary to employ high loadings of tiller in the binder. See, for example, U.S. Pat. Nos. 5,898,009, 6,048,511, and European Patent No. EP 0 939 066 A1, all to Shaffer et al. which teach an alternate methodology to achieve solids hexagonal boron nitride loading approaching 45 vol. %.

There continues to be a need for improved thermally conductive filler materials and methods for forming such materials. In particular, methods are needed by which such materials can be produced economically and in large volumes, with improved control over properties of the final products. In addition, there continues to be a need for improved boron nitride powders, including controlled density powders such as low and medium density powders that maintain sufficient strength for handling and deployment in applications such as in the semiconductor area.

Beyond use of boron nitride powders as a filler material for thermal conductivity applications, there is also a need in the art to produce boron nitride powder having desired and targeted properties for deployment in other end-uses, such as in friction-reducing applications. In this regard, a need exists for highly flexible fabrication processes, which can be used to produce boron nitride powders having widely varying physical, thermal, electrical, mechanical, and chemical properties with high yield and using cost-effective techniques.

SUMMARY

According to one aspect of the present invention, a boron nitride agglomerated powder has an agglomerate fracture strength to tap density ratio of not less than about 11 MPa·cc/g, According to another aspect of the present invention, a boron nitride agglomerated powder an agglomerate fracture strength to envelope density ratio of not less than 6.5 MPa·cc/g.

According to one aspect of the present invention, a method is provided for forming a boron nitride agglomerated powder, in which a feedstock powder is utilized that contains boron nitride agglomerates. The feedstock powder generally has line crystals having a particle size not greater than about 5 μm. The feedstock powder is then heat-treated, to form a heat-treated boron nitride agglomerated powder.

According to another aspect of the present invention, a microelectronic device is provided including an active component, a substrate, and a thermal interface material provided between the active component and the substrate. The active component typically generates heat, and the thermal interface material includes an agglomerate having a fracture strength to envelope density ratio not less than 6.5 MPa·cc/g.

According to another aspect of the present invention, a printed circuit hoard is provided, including multiple layers having at least one layer comprising agglomerates having a fracture strength to envelope density ratio not less than 6.5 MPa·cc/g.

According to yet another feature of the present invention, a composite structural component is provided including a matrix phase and agglomerates having a fracture strength to envelope density ratio not less that about 6.5 MPa·cc/g.

According to another aspect of the present invention, a method for forming a boron nitride agglomerated powder is provided, in which a bulk boron nitride powder containing agglomerates is provided. Then, a portion of the boron nitride agglomerates is removed from the hulk powder, to form a feedstock powder, and feedstock powder is heated to form a boron nitride agglomerated powder.

According to another embodiment of the present invention, a method for forming a boron nitride agglomerated powder is provided, in which a feedstock powder is provided which includes boron nitride agglomerates containing turhostratic boron nitride. The feedstock powder is then heat-treated to form heat-treated boron nitride agglomerated powder.

According to a feature of the present invention, the boron nitride agglomerated powder following heat treatment may be subjected to a mechanical agitating operation, such as crushing. This process is effective to break weak inter-agglomerate bonds which typically form during the heat treatment process, such that the particle size distribution resembles or closely approximates that of the original feedstock powder. Typically, at least 25 wt. % of the heat-treated boron nitride powder following crushing falls within an initial particle size range of the feedstock powder.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

Figure 1:
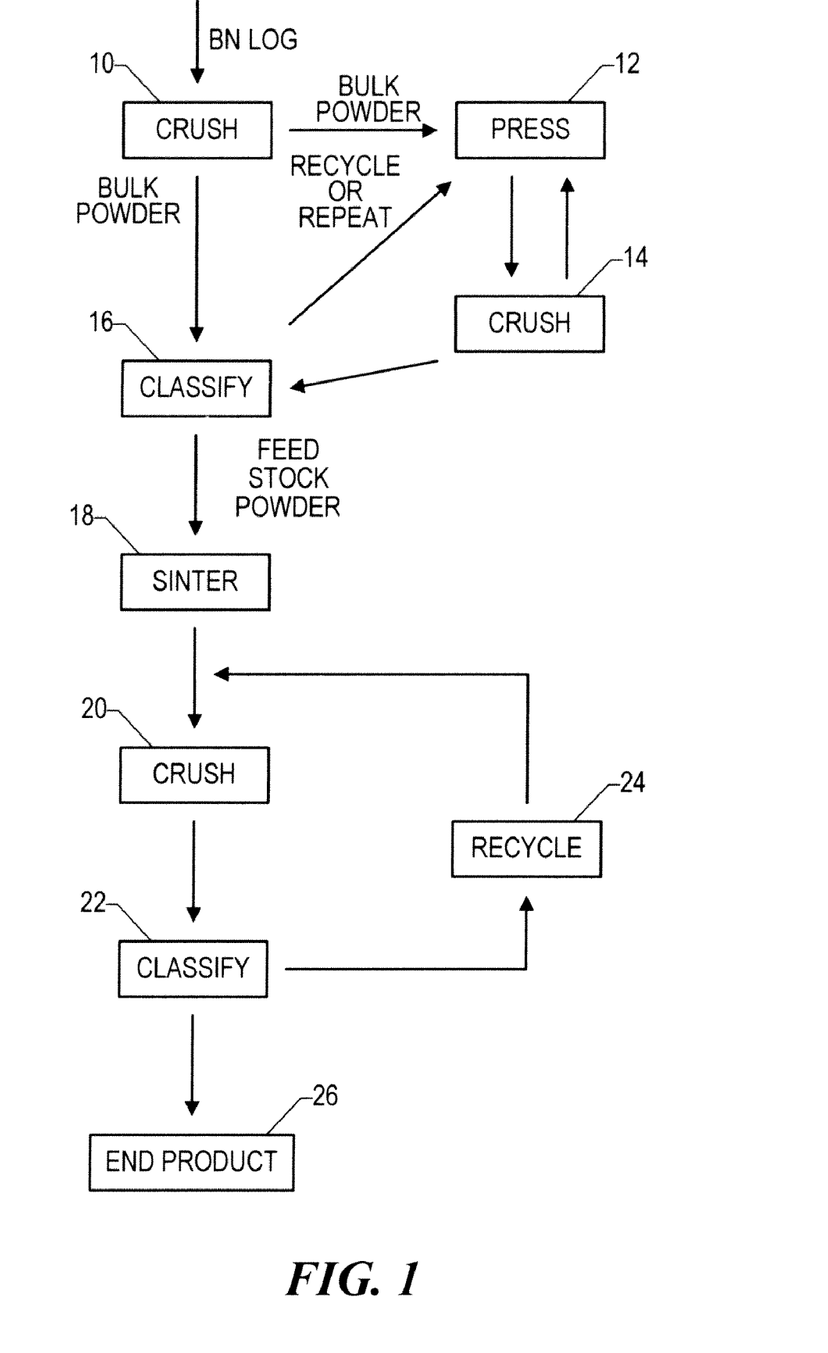
FIG. 1 is a flow chart showing a particular process flow for forming a boron nitride agglomerated powder according to an embodiment of the present invention.

Turning to FIG. 1, a general process flow for forming an agglomerated boron nitride powder is illustrated. The process flow begins with provision of a boron nitride briquette or pellet. Typically, the boron nitride briquette or pellet is formed of boron nitride powder that is pressed together in the form of a briquette or pellet. The size of the briquette or pellet is not particularly important, and it is density can vary widely depending upon the process (e.g., filter cake, roll compact, pill press, isostatic press) to create the boron nitride briquette or pellet. While embodiments of the present invention take advantage of relatively small briquettes or pellets such as on the order of a few grams, larger briquettes such as on the order of 100 kg may also be processed.

A goal of the initial processing of boron nitride briquette or pellet is to provide a feedstock powder that is used according to embodiments of the present invention. The feedstock powder is generally formed by first crushing the boron nitride briquette or pellet at step 10. Suitable methods for crushing the briquette include jaw crushing and roll crushing. The briquette or pellet is crushed into agglomerates of boron nitride having a desired agglomerate size or diameter. Preferably, the briquette or pellet is crushed into agglomerates of boron nitride ranging from about 10 microns to about 1,000 microns. In addition to jaw crushing and/or roll crushing, the bulk powder may be milled, so as to form even smaller particles, such as particles formed of very fine crystals, such as crystals less than 10 microns in size.

In one embodiment, following crushing to form the bulk powder utilizing any combination of jaw crushing, roll crushing and/or fine milling, the bulk powder is classified at step 16 to form a desired feedstock powder, for later processing. Coarse agglomerates that are greater than the target particle size may be re-crushed and classified until they are within the target size distribution. However, it is generally more typical to press the bulk powder at step 12. Typically, pressing is carried out in the form of cold pressing or isostatic pressing to form anew log, briquette, or pellet at this intermediate step, which has desirable crystalline and $B_2O_1$ content properties. Following pressing, the new log, briquette, or pellet is crushed at step 14. The pressing and crushing steps 12 and 14 may be repeated any number of times to modify the crystal size, particle size, particle size distribution, and $B_2O_1$ content of the resulting feedstock powder.

The feedstock powder as well as the bulk powder that is classified at step 16 contain agglomerates. As used herein, an agglomerate is a collection of boron nitride crystals that are bonded together to form an individually identifiable particle. Although such agglomerates are typically formed of crystals, the agglomerate may be partially or fully glassy, such as in the case of impure or turbostratic boron nitride.

In accordance with an embodiment of the present invention, non-agglomerated boron nitride particles (e.g., platelets or crystalline domains) are removed from the powder, as well as the agglomerates not within the desired feedstock powder particle size distribution. Such non-agglomerated boron nitride particles are typically less than 10 microns in size. Preferably, non-agglomerated boron nitride particles are removed to less than about 5%, more preferably, to less than about 1%, such as less than about 0.1%. Suitable techniques for removing the non-agglomerated particles include screening, air classifying, and elutriation, (see Chem. Eng. Handbook, Perry & Chilton, $5^{th}$ Ed., McGraw-Hill (1973), which is hereby incorporated by reference in its entirety). As such removal methods are well known in the art, they will only be discussed briefly herein.

Typically, classification is carried out by screening. Screening is the separation of a mixture of various sized solid particles/agglomerates into two or more portions by means of a screening surface. The screening surface has openings through which the smaller particles/agglomerates will flow, while the larger particles/agglomerates remain on top. This process can be repeated for both the coarse and small particle/agglomerate size streams, as many times as necessary, through varying screen openings to obtain a classification of particles/agglomerates into a desired particle/agglomerate size range.

According to one feature of the process flow shown on FIG. 1, after crushing and classification, as well as with the optional pressing and crushing operations, steps 12 and 14, a feedstock powder is provided that has desirable properties. The feedstock powder is formed of agglomerates within a particular, predetermined particle size range that is taken from or removed from the bulk boron nitride agglomerate powder. Here, the individual agglomerates are composed of fine crystals, also known as crystalline domains. These crystals are bonded together via intra-agglomerate bonding and are individually identifiable through SEM analysis. Generally, it is desired that the crystals have an average crystal size no greater than about 5 microns. More preferably, the crystals have an average crystal size no greater than about 4 microns, even more preferably no greater than about 2 microns.

While the foregoing initial processing to form a feedstock powder has been described in connection with crushing a boron nitride briquette, it is understood that the feedstock powder may be prepared utilizing different processing techniques e.g., carbothermic reduction of boric oxide in the presence of nitrogen, reaction of melamine compounds, acting as a source of strongly reducing nitrogen compounds, to reduce boric oxide to boron nitride and direct nitridation of boric oxide by ammonia. Alternatively, reagents such as boron trichloride and ammonia can be reacted in a pyrolysis process to form highly pure boron nitride. This technique is particularly useful for forming high purity boron nitride powders where purity is emphasized over processing throughput.

While description of the feedstock powder and manipulation of the processing steps have focused on the provision of a feedstock powder having a very fine crystalline size, it is also noted that the feedstock powder may be fully or partially turbostratic. For example, on embodiment has at least 10% by weight turbostratic content, such as at least 20, 30, or 40% turbostratic. Certain embodiments may have a majority portion of turbostratic content. In this regard, such turbostratic boron nitride powder typically has a crystallization index of less than 0.12. For a more detailed description of the properties and crystal structure of turbostratic boron nitride, see Hagio et al., "Microstructural Development with Crystallization of Hexagonal Boron Nitride," J. Mat. Sci. Lett. 16:795-798 (1997), which is hereby incorporated by reference in its entirety.

Typically, The feedstock powder, briquette, log or pellet (all referred to here as compact) has a density within a range of about 0.3 to about 2.0 g/cc. In this regard, the compact density of the feedstock powder is measured by cutting and weighing a cube of known dimensions on each side from a briquette or log or pellet. Another way of characterizing the feedstock powder is by measuring initial tap density for further processing. According to several embodiments of the present invention, the initial tap density is within a range of about 0.2 to about 1.0 g/cc.

Referring back to the pressing step 17, typically pressing is carried out by isostatic pressing, as is well understood in the art. Processing pressures typically exceed 5,000 psi. More typically, greater than about 10,000 psi, preferably above 15,000 psi or even 20,000 psi. Following the second crushing step 14 and subsequent classification at step 16, generally particles are present that fall outside the scope of the desired particle size range of the feedstock powder. For example, the coarse agglomerates that are larger than the target particle size distribution may be re-crushed and classified until they are within the target size range, while smaller agglomerates and non-agglomerated particles that fall below a minimum agglomerate size may be rejected from the feedstock powder. In this latter case, the rejected powder may be recycled, typically by subjecting the recycled powder to pressing again at step 12 followed by crushing at step 14, as indicated in FIG. 1. Such recycled powder is generally, mixed with incoming virgin powder formed pursuant to crushing at step 10. Alternatively, pressing step 12 can be accomplished by uniaxial pressing (pill pressing or tabletting) roll compacting or briquetting. The pressures applied is sufficient to obtain a desired density of the consolidated body, as described previously. Alternatively, compacts can be formed by wet processes, whereby a slurry of boron nitride is spray dried or filtered forming a compact.

While the particle size range for the agglomerated feedstock powder may an considerably depending upon the desired end properties in the final powder product, typically the particle size of the feedstock powder falls within a range of about 20 to about 1,000 microns, typically about 40 to 500 microns. Narrower particle size ranges within the foregoing broad ranges are typically processed for tight particle size control in the final product. As used herein, particle size range is typically determined by the screening technique described above. In this regard, it is noted that screening is not an ideal process, and as such, a certain proportion of undesirable particle sizes may be present, most typically, fines may be caught within the product on the bottom screen, thereby shifting the particle size range to be slightly finer than specified.

As shown in FIG. 1, following classification, the feedstock powder is then subjected to a sintering operation at step 18. Here, sintering is effected to the boron nitride agglomerate in powder form, rather than in any sort of bulk form such as a brick, pellet or log. During this sintering operation, it is typical that agglomerates bond together via weak inter-agglomerate bonds (necking). Accordingly, it is generally desirable to subject the heat-treated or sintered powder to a crushing operation at step 20. As described above in connection with step 10, the crushing operation at step 20 may be carried out by various techniques, including jaw crushing and coarse roll crushing, although milling is typically not carried out at step 20 so as to preserve as close as possible the initial particle size (agglomerate) range of the original feedstock powder.

Typically, the sintering operation at step 18 is carried out at a temperature to facilitate crystal growth and crystallization of the amorphous phases (turbostratic), so as to form a generally hexagonal crystal structure in the heat-treated product. In this regard, the sintering temperature is typically greater than at least about 1,400° C., such as within a range of about 1,600 to 2,400° C. Sintering temperatures range between 1,800° C. and 2,300° C. and specific sintering temperatures range within about 1.850° C. to about 1,900° C. Typically, the environment during sintering is inert, to minimize or prevent unwanted reactions with the boron nitride feedstock powder. In this regard, the sintering furnace is typically evacuated (vacuum) such as at a pressure less than about 1 atm. Gases present within the sintering environment are typically inert such as argon or nitrogen ($N_2$). Typical heat-treatment preparations fall within a range of about 0.25 to 12 hours, dependent upon furnace design and heating rates.

As a result of the sintering operation, the density of the feedstock powder is generally reduced, unlike sintering operations with other types of ceramic materials. One explanation for the reduction in density during "sintering" is that neck formation occurs between adjacent particles by a non-densifying diffusion process like vapor-phase Transport. (see Modern Ceramic Engineering, D. W. Richerson, Chapter 7, 1982) It is typical to see reduction in density on the order of at least 0.1 g/cc, such as at least 0.2 g/cc. Particular examples of heat-treated powder exhibited a tap density on the order of about 0.2 g/cc to about 1.0 g/cc, following crushing at step 20 and classification at step 22. In this regard, classification at step 22 would be carried out by any one of the techniques described above in connection with classification at step 16.

According to an embodiment of the present invention, classification at step 22 reveals that at least 25 wt. % of the heat-treated boron nitride agglomerated powder (following crushing) falls within the initial particle size range of the feedstock powder. Generally the heat-treated boron nitride powder (following crushing) has an average particle size of at least 20 microns, and has a particle size range within about 40 microns to about 500 microns. In this regard, it is generally desired that the particle size distribution of the final powder product approximates that of the original feedstock powder. This feature is effective to improve yield of the final, heat-treated crushed and classified boron nitride agglomerated powder over state-of-the-art processing techniques, such as techniques that rely on heat treatment of boron nitride in pellet, brick, log or briquette form.

Figure 2:
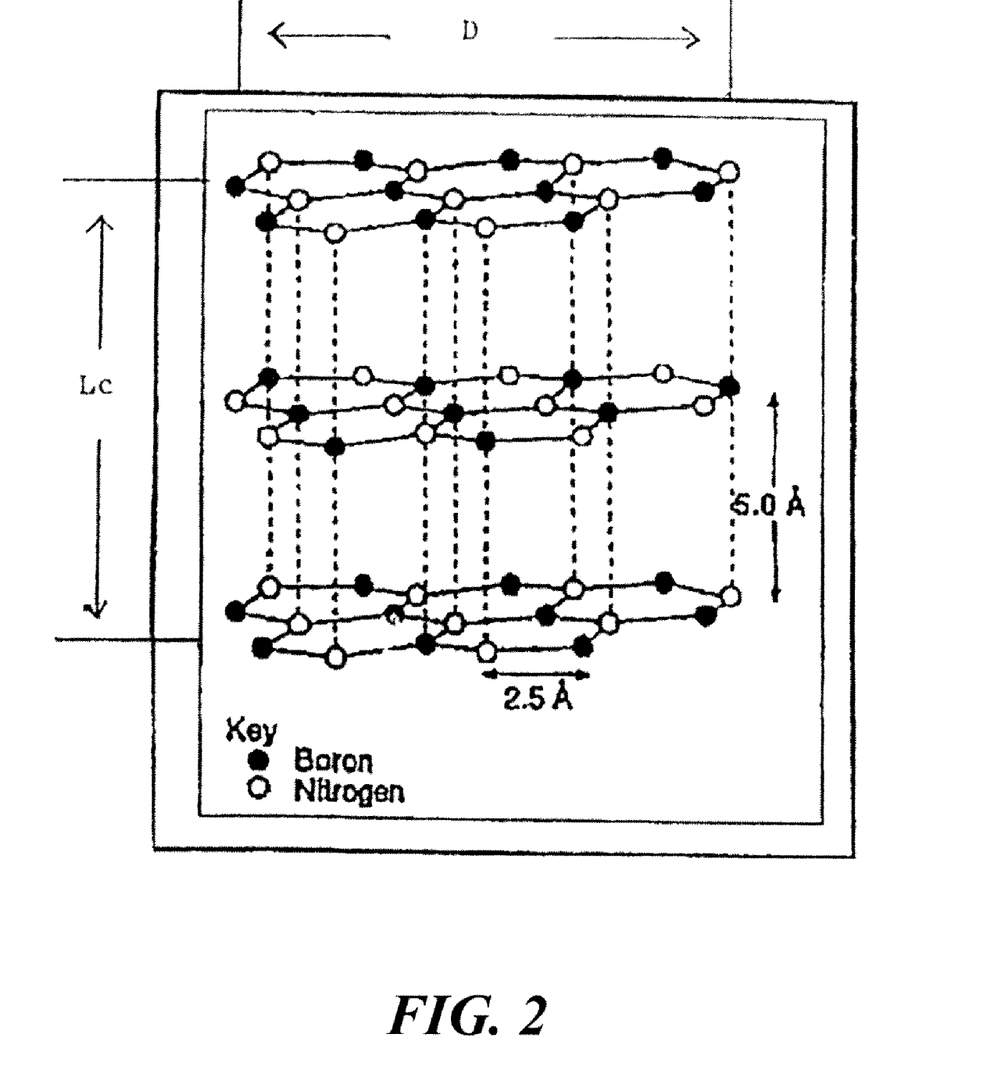
FIG. 2 illustrates the ideal crystal structure of hexagonal boron nitride.

The heat-treated boron nitride agglomerated powder typically has a hexagonal crystal structure. Hexagonal boron nitride is an inert, lubricious ceramic material having a platey hexagonal crystalline structure (similar to that of graphite) ("h-BN"). The well-known anisotropic nature of h-BN can be easily explained by referring to FIG. 2, which shows hexagons of a h-BN particle. The diameter of the h-BN particle platelet is the dimension shown as D in FIG. 2, and is referred to as the a-direction. BN is covalently bonded in the plane of the a-direction. The particle thickness is the dimension shown as Lc, which is perpendicular to diameter and is referred to as the c-direction. Stacked BN hexagons (i.e. in the c-direction) are held together by Van der Waals forces, which are relatively weak.

The final, heat-treated crushed and classified agglomerated boron nitride powder may have a crystal structure that is hexagonal, ranging from a highly ordered hexagonal crystal structure to a disordered hexagonal structure. Such powders typically have a crystallization index on the order of 0.12 and higher. (See Hubacek, "Hypothetical Model of Turbostratic Layered Boron Nitride," J. Cer. Soc. of Japan, 104:695-98 (1996), which is hereby incorporated by reference in its entirety.)

In addition, the sintering operation is effective to volatilize impurities and surface oxide contaminants. The resulting product, prior to crushing, is a "cake" of weakly aggregated agglomerates that are easily broken down to a particle size distribution resembling that of the initial particle size distribution of the feedstock powder.

It is noted that while recycling steps are shown in FIG. 1 between steps 12 and 16, and between steps 20 and 22, recycling steps may be employed between various process steps of the basic flow shown in FIG. 1.

The final, agglomerated boron nitride product typically has a relatively high fracture strength, particularly with respect to its envelope density (actual agglomerate density) and/or the powder tap density (bulk density of the powder). For example, one embodiment has a fracture strength to tap density ratio of not less than about 11 MPa·cc/g, such as not less than about 12 MPa·cc/g, 13 MPa·cc/g or even 14 MPa·cc/g. In terms of envelope density, such ratio is typically not less than 6.5 MPa·cc/g, such not less than 6.7 MPa·cc/g, or not less than 6.9 MPa·cc/g.

As to the powder particle size characterization, the powder may have an average agglomerate size within a range of about 20 to 500 µm, such as about 40 to 200 µm. In this regard, certain embodiments may have at least 60% of the powder falling within a particle distribution range of about 40 to 200 µm, or at within a range of 40 to 150 µm.

Figure 4:
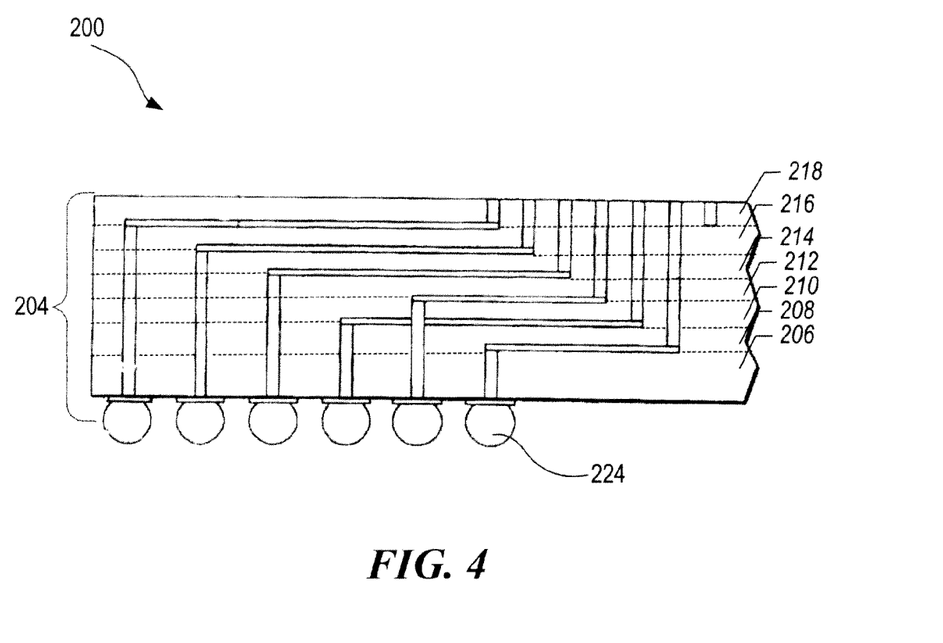
FIG. 4 illustrates a cross sectional view of a printed circuit board according to an embodiment of the present invention.

According to embodiments of the present invention, powder having characteristics as described above may be provided. However, other embodiments utilize the powder in various applications. For example, turning to FIG. 4, a printed circuit board 200 is provided including multiple layers 206-218 forming a stack of layers 204. As illustrated, one of the opposite major surfaces includes a plurality of solder humps for electrical interconnection with other electronic components. Although not shown, the opposite major surface of the printed circuit board may have electrical traces there along for routing electrical signals. According to the embodiment shown in FIG. 4, any one of or multiple layers 206-218 may include agglomerates as discussed above. Typically, the loading ratio of agglomerates is sufficient such that the agglomerates provide an interconnected network and generally contact each other for efficient heat transfer. This interconnected network of agglomerates is referred to herein as a percolated structure and may generally form a skeletal structure that extends through and is imbedded in a matrix phase. Typically, the matrix phase is formed of a polymer, including organic polymers. In certain embodiments, it is desirable to utilize a thermoplastic polymer for processing ease. Layers incorporating agglomerates according to embodiments of the present invention advantageously improve heat transfer of the printed circuit board for demanding electronic applications.

Figure 5:
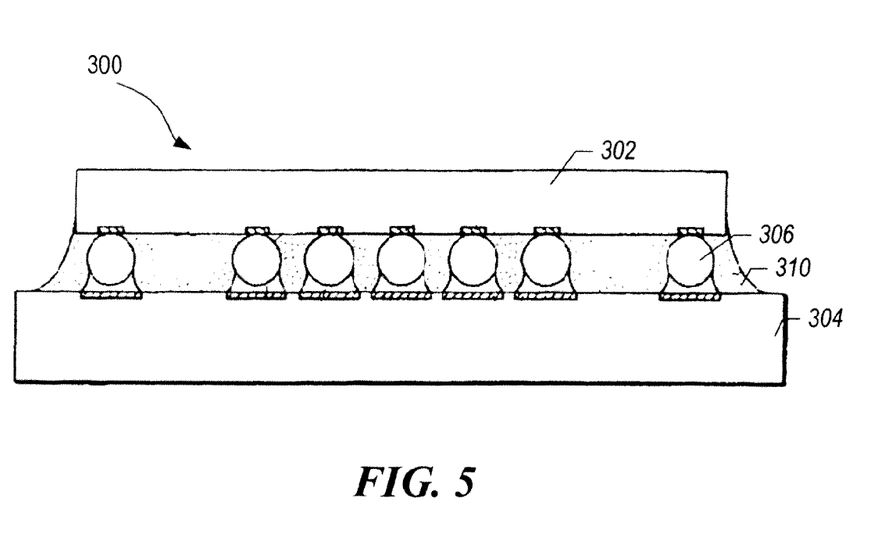
FIG. 5 illustrates a microelectronic device including an integrated circuit bonded to a substrate through use of a thermal transfer film.

Turning to FIG. 5, another embodiment of the present invention is shown, including a microelectronic device. In this particular embodiment, the microelectronic device 300 includes a semiconductor die 302 in a packaged state, namely, flip-chip bonded to an underlying substrate 304, which is provided for electrical interconnection with other microelectronic devices. The microelectronic device 300 includes a thermal transfer film 310 that includes agglomerates as disclosed above, provided in a matrix phase, typically a polymer such as a resin. As discussed above in connection with the printed circuit board, the agglomerates form an interconnected network or percolated structure for improving thermal transfer between the integrated circuit 302 and the underlying substrate 304. As is generally understood in the art, electrical interconnection between the integrated circuit and the substrate is achieved through incorporation of solder humps 306 bonded to respective pads on the semiconductor die, bonded to the substrate contacts through re-flow of the solder material.

According to yet another feature of the present invention, a composite structural component is provided that includes a matrix phase and agglomerates as discussed above. The composite structural component may take on various structural forms and in particular embodiments forms an integral component of a microelectronic device such as a hard disk drive. In the particular case of the hard disk drive, the component may be an actuator arm.

Figure 6:
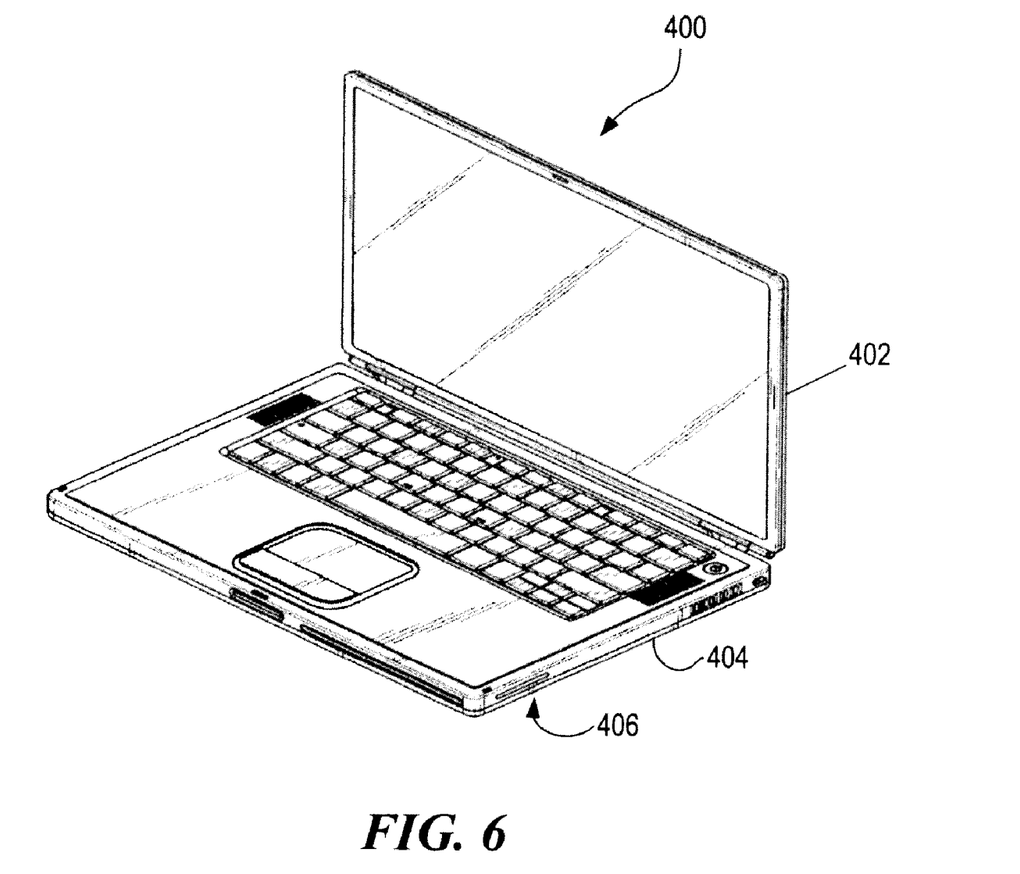
FIG. 6 illustrates a laptop computer incorporating a case according an embodiment of the present invention.

Alternatively, the structural component may provide a computer case, as is generally shown in FIG. 6. FIG. 6 illustrates a notebook computer 400 having a case having two halves 402 and 404. Case portion 402 generally defines a structural support for and back surface of an LCD screen of the computer, while case portion 404 encloses and protects the sensitive microelectronic components of the laptop computer 400 and includes a bottom surface 406. The case is desirably formed of a composite material, including a matrix phase and agglomerates according to embodiments of the present invention. The matrix phase may be a structurally sound polymer material such as a thermoplastic polymer. While the laptop is shown in FIG. 6, it is understood that the case may be configured suitable for desktop computers as well as for servers and other computing devices.

Further, among the various types of shells or cases for microelectronic devices, the structural component may be in the form of a telephone casing, defining the outer structural surface of a telephone handset such as a mobile telephone.

The following is not an exhaustive list of suitable composite structural components, and a myriad geometric configurations may be provided for various applications, including microelectronic applications. For example, the structural component may take on the form of heat pipe as described generally in U.S. Pat. No. 6,585,039, a composite heater as in U.S. Pat. Nos. 6,300,607 and 6,124,579, a brake pad structure as in U.S. Pat. No. 5,984,055, or as various overvoltage components as in U.S. Pat. No. 6,251,513.

The following examples reference screening parameters which, unless otherwise noted, are based on the tensile bolting cloth (TBC) standard. The following Table 1 is provided to convert between TBC mesh size, U.S. Sieve, microns and mils, for ease of interpretation.

TABLE 1

| Tensile Bolting Cloth | | | |
|---|---|---|---|
| US Sieve | TBC | Microns | Mils |
| 12 | | 1680 | 66 |
| 14 | 16 | 1410 | 56 |
| 16 | 18 | 1190 | 47 |

TABLE 1-continued

Tensile Bolting Cloth

| US Sieve | TBC | Microns | Mils |
|---|---|---|---|
| 18 | 22 | 1000 | 39 |
| 20 | 24 | 841 | 33 |
| 25 | 28 | 707 | 28 |
| 35 | 38 | 500 | 20 |
| 40 | 46 | 420 | 17 |
| 45 | 52 | 354 | 14 |
| 50 | 62 | 297 | 12 |
| 60 | 74 | 250 | 10 |
| 70 | 84 | 210 | 8.3 |
| 80 | 94 | 177 | 7.0 |
| 100 | 120 | 149 | 5.9 |
| 120 | 145 | 125 | 4.9 |
| 140 | 165 | 105 | 4.1 |
| 170 | 200 | 86 | 3.4 |
| 200 | 230 | 74 | 2.9 |
| 230 | | 63 | 2.5 |
| 270 | | 53 | 2.1 |
| 325 | | 44 | 1.7 |
| 400 | | 38 | 1.5 |

EXAMPLES

Example 1

Approximately 50 lbs of a feedstock boron nitride powder comprised of fine crystals having a particle size not greater than about 5 µm was consolidated with an isostatic press at 20 ksi. The resulting material was then crushed using a jaw crusher, then a roll type crusher. The resulting powder was then screened to separate fine and coarse agglomerates. Coarse agglomerates, for the purpose of this example, were above 150 microns and fine agglomerates, below 40 microns. Screening was conducted utilizing a screener fitted with 120 and 200 TBC (Tensile Bolting Cloth) screens. The resulting 8 lbs of material that was 60% above 74 microns was heat-treated at approximately 1900° C. for 12 hours to produce a high purity boron nitride cake. This cake was then crushed using a jaw crusher, then a roll type crusher. The resulting powder was then screened to separate fine and coarse agglomerates. Coarse agglomerates, for the purpose of this example, were above 150 microns and fine agglomerates, below 150 microns. Agglomerates greater than 150 microns in size were re-crushed until they were within the target agglomerate size range. i.e. less than 150 microns, for this example. The resulting 2 lbs of screened material was 95% between 150 microns and 74 microns and possessed a tap density of approximately 0.50 g/cc. The strength of selected particles, 125 microns in diameter, was 8.2 MPa.

Example 2

Approximately 50 lbs of a feedstock boron nitride powder comprised of fine crystals having a particle size not greater than about 5 µm was crushed using a jaw crusher, then a roll type crusher. The resulting powder was then screened to separate fine and coarse agglomerates. Coarse agglomerates, for the purpose of this example, were above 150 microns and fine agglomerates, below 40 microns. Screening was conducted utilizing a screener fitted with 120 and 200 TBC (Tensile Bolting Cloth) screens. The resulting 5 lbs of material that was 60% above 74 microns was heat-treated at approximately 1900° C. for 12 hours to produce a high purity boron nitride cake. This cake was then crushed using a jaw crusher, then a roll type crusher. The resulting powder was then screened to separate fine and coarse agglomerates. Coarse agglomerates, for the purpose of this example, were above 150 microns and fine agglomerates, below 150 microns. Agglomerates greater than 150 microns in size were re-crushed until they were within the target agglomerate size range, i.e. less than 150 microns, for this example. The resulting 2 lbs of screened material was 95% between 150 microns and 74 microns and possessed a tap density of approximately 0.35 g/cc. The strength of selected particles, 125 microns in diameter, was 4.5 MPa.

Example 3

Approximately 100 lbs of a feedstock boron nitride powder comprised of fine crystals having a particle size not greater than about 5 µm was consolidated with an isostatic press at 20 ksi. The resulting material was then crushed using a jaw crusher, then a roll type crusher. The resulting powder was then screened to separate fine and coarse agglomerates. Coarse agglomerates, for the purpose of this example, were above 200 microns and fine agglomerates, below 40 microns. Agglomerates greater than 200 microns in size were recrushed until they ere within the target agglomerate size range, i.e. less than 200 microns, for this example. The fine agglomerates and crystallites that were produced during crushing, typically below 10 microns in sire, were separated from the larger agglomerates by air classification. The resulting 18 lbs. of coarse product was screened utilizing a screener fitted with a 88 and 120 TBC (Tensile Bolting Cloth) screens (Kason Corporation, Millburn, N.J.). The resulting 3 lbs of material that was 60% above 150 microns were heat-treated at approximately 1900° C. for 12 hours to produce a high purity boron nitride cake. This cake was then crushed using a jaw crusher, then a roll type crusher. The resulting powder was then screened to separate fine and coarse agglomerates. Coarse agglomerates, for the purpose of this example, were above 200 microns and fine agglomerates, below 200 microns. The resulting 2 lbs of screened material was 95% between 200 microns and 74 microns and possessed a tap density of approximately 0.50 g/cc. The strength of selected particles, 150 microns in diameter, was 7.5 MPa.

Following the process flows above, additional samples were prepared, having a range of tap densities, provided below in Table 2 as Examples 5-7. In addition, Comparative Examples 1, 2, and 3 were prepared for comparative testing. The comparative examples were prepared in a manner similar to Examples 1-3 described above, with a significant difference that the comparative examples were created based upon heat treating the material in log or briquette form, rather than agglomerated powder form as described above in connection with embodiments of the present invention. All samples were subjected to agglomerate strength testing, by utilizing the testing apparatus shown in FIG. 3. The apparatus consists of a small load frame 100 with a movable stage 110. The stage motion was in x, y, and z direction and was controlled by stepping motors (Newport PM 500 Precision Motion Controller). The z-motion was set to 2 µm/s. A 4.9 N (500 g) load cell 102 was used and the samples were placed on highly polished and parallel SiC anvils 104, 106. The stage motion was controlled through LabView. Data acquisition was performed at a sampling rate of 20 datapoints/s resulting in a resolution of 0.1 µm and 0.01 N.

Figure 3:
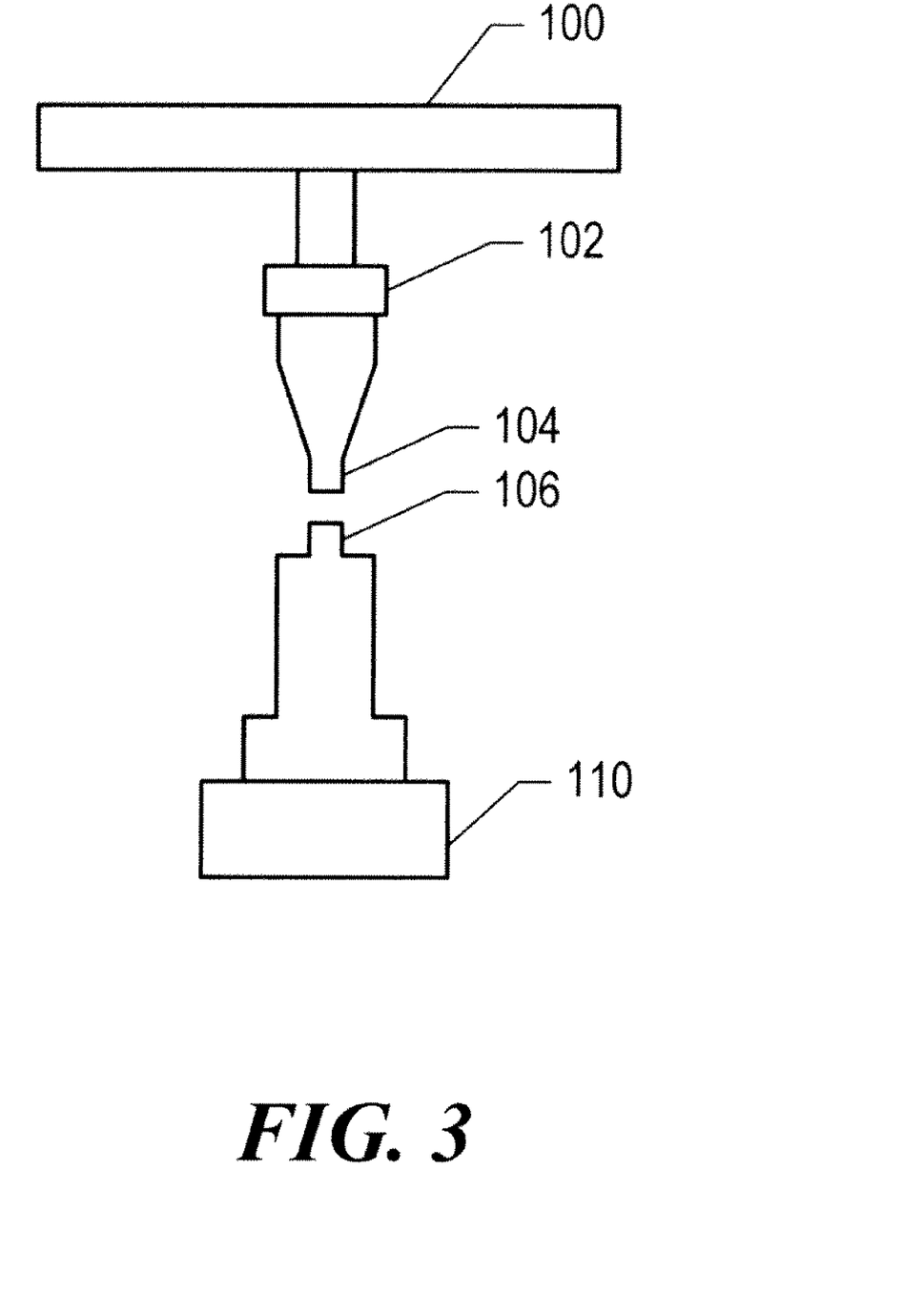
FIG. 3 illustrates a testing apparatus used to characterize embodiments of the present invention.

Samples for testing were prepared by hand-picking agglomerates of similar size from the sample hatches, and single agglomerates were tested for fracture strength. The effective tensile strength of each agglomerate was calculated assuming the irregular shape is somewhere between a sphere and a cube, yielding $$\sigma_e = 1.37 \frac{P}{a^2}$$

where P is the fracture load and a the diameter (size) of the agglomerate.

Tap density was measured in accordance with ASTM B527-70.

Envelope density was measured by Hg porosimetry, by infiltrating Hg liquid under a pressure of 40 Kpsi. Envelope density represents the average density of the agglomerates of the sample, as opposed the tap density, which is a bulk density measurement.

TABLE 2

| ID | Fracture strength [MPa] | Tap Density (g/cc) | Agglomerate Size [um] | Strength/$\rho$ (tap) ratio [MPa·cc/g] | Envelope Density (g/cc) | Strength/$\rho$ (envelope) ratio [MPa·cc/g] |
|---|---|---|---|---|---|---|
| CE1 | 5.1 | .48 | 125 | 10.6 | .807 | 6.32 |
| E1 | 8.2 | .48 | 125 | 17.1 | .792 | 10.38 |
| E2 | 4.5 | .35 | 125 | 12.9 | .648 | 6.94 |
| CE2 | 5.7 | .68 | 125 | 8.4 | 1.078 | 5.29 |
| CE3 | 4.4 | .71 | 125 | 6.2 | 1.396 | 3.15 |
| E3 | 7.5 | .48 | 150 | 15.6 | .755 | 9.93 |

According to the foregoing, relatively high strength, controlled density powders are provided, and in particular, high strength, low and medium density powders are provided for that are particularly suitable for thermally conductive applications. In addition, the powders may have generally isotropic behavior, thermally and structurally. Still further, embodiments of the present invention also provide processing techniques for forming agglomerated boron nitride powders. Such processing techniques are highly flexible, and are effective to improve yield, and accordingly, be cost effective. While powders according to embodiments of the present invention may be particularly used for thermal conduction applications, such as in the semiconductor art, the processing techniques are flexible, capable of creating boron nitride powders for other applications.

What is claimed is:

1. A microelectronic device, comprising:
    an active component that generates heat;
    a substrate; and
    a thermal interface material provided between the active component and the substrate, the thermal interface material comprising boron nitride agglomerates having a fracture strength to envelope density ratio not less than 6.5 MPa·cc/g.

2. The microelectronic device of claim 1, wherein the active component comprises a semiconductor device.

3. The microelectronic device of claim 1, wherein the thermal interface material comprises said boron nitride agglomerates contained in a polymer matrix, the boron nitride agglomerates forming a percolated structure for heat transfer.

4. The microelectronic device of claim 2, wherein the ratio is not less than 6.7 MPa·cc/g.

5. A printed circuit board, comprising:
    multiple layers, including at least one layer comprising boron nitride agglomerates having a fracture strength to envelope density ratio not less than 6.5 MPa·cc/g.

6. The printed circuit board of claim 5, further comprising conductive features extending through the layers for electrical connection.

* * * * *